(12) United States Patent
Visocchi et al.

(10) Patent No.: US 7,183,859 B2
(45) Date of Patent: Feb. 27, 2007

(54) POWER SUPPLY REJECTION FOR HIGH BANDWIDTH TRANSIMPEDANCE AMPLIFIER CIRCUITS (TIAS)

(75) Inventors: Pasqualino Michele Visocchi, High Barnet, Barnet (GB); Edward John Wemyss Whittaker, Bishops Stortford (GB)

(73) Assignee: SiGe Semiconductor Inc., Ottawa (CA)

( * ) Notice: Subject to any disclaimer, the term of this patent is extended or adjusted under 35 U.S.C. 154(b) by 337 days.

(21) Appl. No.: 10/654,969

(22) Filed: Sep. 5, 2003

(65) Prior Publication Data

US 2005/0051703 A1    Mar. 10, 2005

(51) Int. Cl.
*H03F 3/08* (2006.01)
(52) U.S. Cl. .................... 330/308; 250/214 A
(58) Field of Classification Search ............. 330/59, 330/308; 250/214 A, 214 AG
See application file for complete search history.

(56) References Cited

U.S. PATENT DOCUMENTS

| | | | |
|---|---|---|---|
| 6,242,732 B1* | 6/2001 | Rantakari | 330/308 |
| 6,444,970 B1* | 9/2002 | Barbato | 330/308 |
| 6,552,615 B1* | 4/2003 | Pavan et al. | 330/308 |

* cited by examiner

*Primary Examiner*—Khanh Van Nguyen
(74) *Attorney, Agent, or Firm*—Kenyon & Kenyon LLP

(57) ABSTRACT

Power supply noise affects the performance of many amplifier circuits. Power supply noise rejection circuits are typically used in conjunction with amplifier circuits to reduce the effects of the noise. Unfortunately, the main issue with a transimpedance amplifier (TIA) is that it has a single input port and a single output port, and the output ports are often required to be of a differential type in order to interface with a differential input post amplifier circuit. As a result, the conversion from single input port operation to a dual input port configuration for differential operation is often the cause of poor power supply noise rejection. A circuit is thus provided that overcomes the limitations in the prior art by providing a differential TIA for use with a filter circuit and differential amplifier that overcomes the limitations of the prior art.

18 Claims, 2 Drawing Sheets

POWER SUPPLY REJECTION FOR HIGH BANDWIDTH TRANSIMPEDANCE AMPLIFIER CIRCUITS (TIAS)

FIELD OF THE INVENTION

The invention relates to the field of amplifier circuits and more specifically to the field of power supply noise rejection circuitry for use with a transimpedance amplifier circuit.

BACKGROUND OF THE INVENTION

The ever increasing demands for high capacity communications systems has resulted in a wide spread deployment of optical fiber networks across the world. A fundamental component used in such systems receives pulses of light and converts these into electrical signals. The pulses of light in such systems comprise a bit stream of information. This fundamental component employed in the fiber optic networks is commonly known as an optical receiver module. Within the optical receiver, a photodetector is typically employed to receive the light pulses and an amplifying circuit is employed for amplifying photocurrent generated within the photodetector.

Transimpedance amplifiers (TIAs) are typically used within optical receiver modules to amplify and transform weak photocurrents received from the photodetector, in the form of a photodiode or a PIN diode. The TIA transforms the photocurrent into an output voltage that is further provided to other stages of the optical receiver module. Since TIAs are used to deal with both strong and weak photocurrents, noise in the resultant amplification and transformation to a voltage signal is typically a problem. Indeed, for those skilled in the art of the design of TIAs, it is well understood and appreciated that the noise introduced by the TIA, in many circumstances, limits the ability of the optical receiver module to faithfully reconstruct the intended stream of information. Furthermore, a relationship between the rate at which errors are produced by the receiver—often called the Bit Error Rate (BER), and the noise generated by the TIA can be shown. Thus, the optical receiver module needs to have low noise amplification performed on the weak photocurrents in order to facilitate optical transmission of information. This is especially true in circumstances where the distance that the optical signal must travel is long and results in weak optical pulses at the receiver. It is known to those skilled in the art that long transmission distances—the distance between a transmitter and a receiver—serves to attenuate the initial transmitted optical signal strength and places a greater burden upon the receiver module to avoid errors. Furthermore, it is also known that cost of an optical communication system is reduced if a signal is transmitted along a longer length of optical fiber or, in the alternative, if less optical power is transmitted. Thus, providing low noise amplification for the TIA is important in order to reduce the bit error rate (BER) of the received and amplified signal.

However, if the power supply noise is present, this can appear at the output port of the TIA in the form of an interference signal along with output noise of the TIA. The resulting effect is to cause an optical penalty of the TIA with the effect of reducing optical sensitivity. Therefore, to preserve the low noise properties of the TIA, a high power supply rejection (PSR) is typically required at frequencies below 100 KHz. For frequencies above 100 KHz, off-chip power supply filters are typically used.

Most amplifiers circuits offer a differential input signal and output signal mode of operation and as such the differential amplifier circuits are designed to have high gain and high common mode rejection. Unfortunately, the main issue with a transimpedance amplifier (TIA) is that it has a single input port and a dual output port, and the output ports are often required to be of a differential type in order to interface with a differential input post amplifier circuit. As a result, the conversion from single input port operation to a dual output port configuration for differential operation is often the cause of poor power supply rejection.

A need therefore exists to provide a power supply noise rejection circuit for use with a TIA that allows for a reduction in amplifier output signal noise. It is therefore an object of the invention to provide a power supply noise rejection circuit for use with a TIA that provides power supply noise rejection using a reduced amount of circuitry, thus reducing power dissipation and semiconductor circuit area.

SUMMARY OF THE INVENTION

In accordance with the invention there is provided a circuit for connecting to a power supply having power supply noise, the circuit for amplifying an input signal from a photodetector comprising: a transimpedance amplifier (TIA) circuit for operating in a differential manner and having a gain and a first input port for receiving the input signal from the photodetector, a second input port and an output port, the TIA for providing a TIA output signal comprising a voltage ripple signal dependent on the power supply noise and an amplified signal dependent on the input signal and the gain of the TIA; a first biasing circuit coupled to the second input port for providing a first bias signal thereto, the first bias signal including the voltage ripple signal dependent on the power supply noise; and, a filter circuit coupled to the output port of the TIA for filtering the TIA output signal to form a filtered signal, the filter circuit for filtering the TIA output signal in dependence upon an AC component of the first bias signal and for providing the filtered signal to a filter output port thereof.

In accordance with the invention there is provided a method of performing power supply noise rejection for providing an output signal comprising the steps of: providing a TIA having two input ports; providing an input signal for amplification to a negative input port of the TIA; providing a first bias signal having a voltage ripple to a positive input port of the TIA; amplifying the input signal to form a portion of an amplified signal, the amplified signal comprising a noise signal representative of power supply noise and an amplified version of the input signal; filtering the amplified signal to form a filtered signal comprised of power supply noise; differentially amplifying the filtered signal and the amplified signal to provide an output signal from the amplifier circuit having an amplified version of the input signal and an attenuated version of the power supply noise.

In accordance with the invention there is provided a single ended to dual conversion circuit comprising: a transimpedance amplifier (TIA) circuit for operating in a differential manner and having a gain and a first input port for receiving the input signal from the photodetector, a second input port and an output port, the TIA for providing a TIA output signal comprising a voltage ripple signal dependent on the power supply noise and an amplified signal dependent on the input signal and the gain of the TIA; a first biasing circuit coupled to the second input port for providing a first bias signal thereto, the first bias signal comprising the voltage ripple signal dependent on the power supply noise; a filter circuit coupled to the output port of the TIA for filtering the TIA output signal to form a filtered signal, the filter circuit for filtering the TIA output signal in dependence upon an AC component of the first bias signal and for providing the filtered signal to a filter output port thereof; and, a differential amplifier having a positive input port for receiving the TIA output signal and having a negative input port for receiving the filtered signal, the differential amplifier having a two output ports for providing a differential output signal therefrom, the differential output signal representative of an amplified difference between these two input signal and an attenuated other than a difference between these two input signals.

BRIEF DESCRIPTION OF THE DRAWINGS

Exemplary embodiments of the invention will now be described in conjunction with the following drawings, in which.

DETAILED DESCRIPTION OF THE INVENTION

The most commonly used technique to achieve power supply rejection (PSR) is to design amplifier circuits in a fully differential manner for receiving a differential input signal and for providing a differential output signal. However, transimpedance amplifiers (TIAs) typically provide a single ended input port for connection to a photodetector and a differential voltage output signal, where the single ended to differential conversion is typically performed on chip. The manner of this single ended to differential conversion determines the degree of Power Supply Rejection (PSR) achievable by the TIA.

Figure 1:
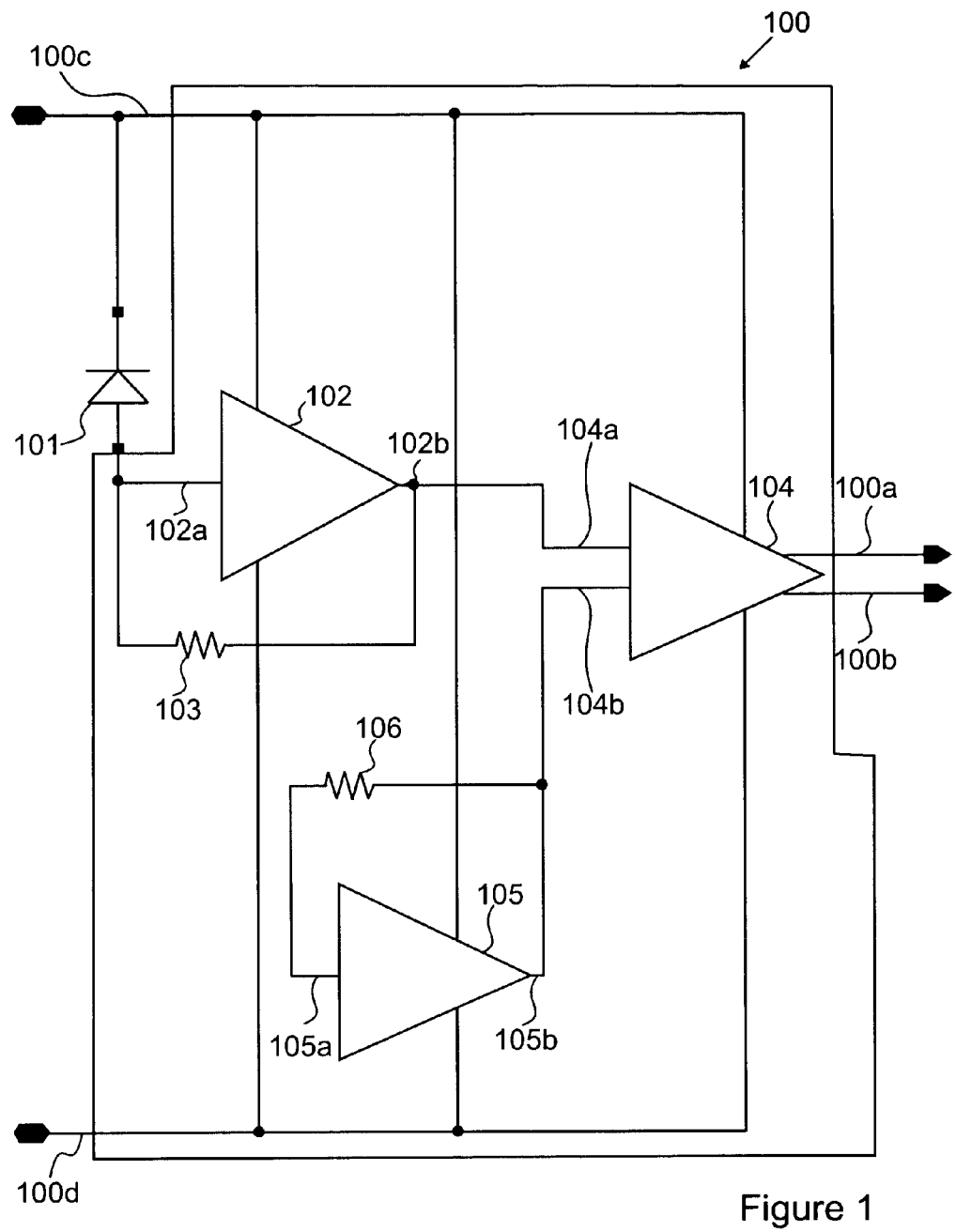
FIG. 1 illustrates a prior art amplifier circuit arrangement used to achieve a high degree of PSR for use with a TIA; and, FIG. 2 illustrates an amplifier circuit in accordance with an embodiment of the invention that utilizes a differential TIA, filter circuit and differential amplifier to overcome the limitations of the prior art.

FIG. 1 illustrates a prior art amplifier circuit arrangement 100 used to achieve a high degree of PSR for use with a TIA 102. A photodetector 101, in the form of a PIN diode 101, anode terminal is connected to the input port 102a of a TIA 102 while its cathode is connected to a first voltage input port 100c for receiving Vpos, or some other positive bias voltage, from a power supply (not shown). The output port 102b of the TIA 102 is connected using a feedback resistor 103 to the input port 102a of the TIA 102 for establishing a gain of the TIA 102. The output port 102b of the TIA provides an output signal that has amplification—gain— dependent upon a value of the feedback resistor 103 as well as some unwanted power supply noise. The output signal of the TIA 102 is provided to a positive input port 104a of a differential amplifier circuit 104.

A replica of the TIA 105 is reproduced with its output port 105b connected to a negative input port 104b of the differential amplifier 104. A feedback resistor 106, having a same value as feedback resistor 103, is disposed between the replica TIA 105 input port 105a and its output port 105b. The replica, or dummy TIA, provides a same DC output voltage and the same amount of unwanted power supply noise as the TIA 102 connected to the photodiode. The differential amplifier 104 is therefore designed to have a high differential gain and a high common mode rejection (CMR), thus the output signals of the differential amplifier 104 preferably result in an amplification of a desired signal, which is the photocurrent generated by the photodetector 101 and attenuates the unwanted signal, which is the power supply noise.

Although the circuit illustrated in FIG. 1 achieves high PSR, it unfortunately has a number of disadvantages. The use of a dummy TIA stage 105 increases both integrated circuit (IC) die real estate, but also increases power dissipation of the IC. In addition, the noise of the dummy TIA 105 adds to the noise of the TIA 102 in an RMS manner, which in turn reduces the optical sensitivity of the amplifier circuit 100 by approximately 1.5 dB. Of course, this 1.5 dB optical sensitivity penalty is reduceable by decreasing the bandwidth of the dummy TIA 105 to a point where its noise contribution is minimized. However, in order to reduce the bandwidth a large 'on chip' capacitor is typically utilized, which further increase IC die area.

Figure 2:
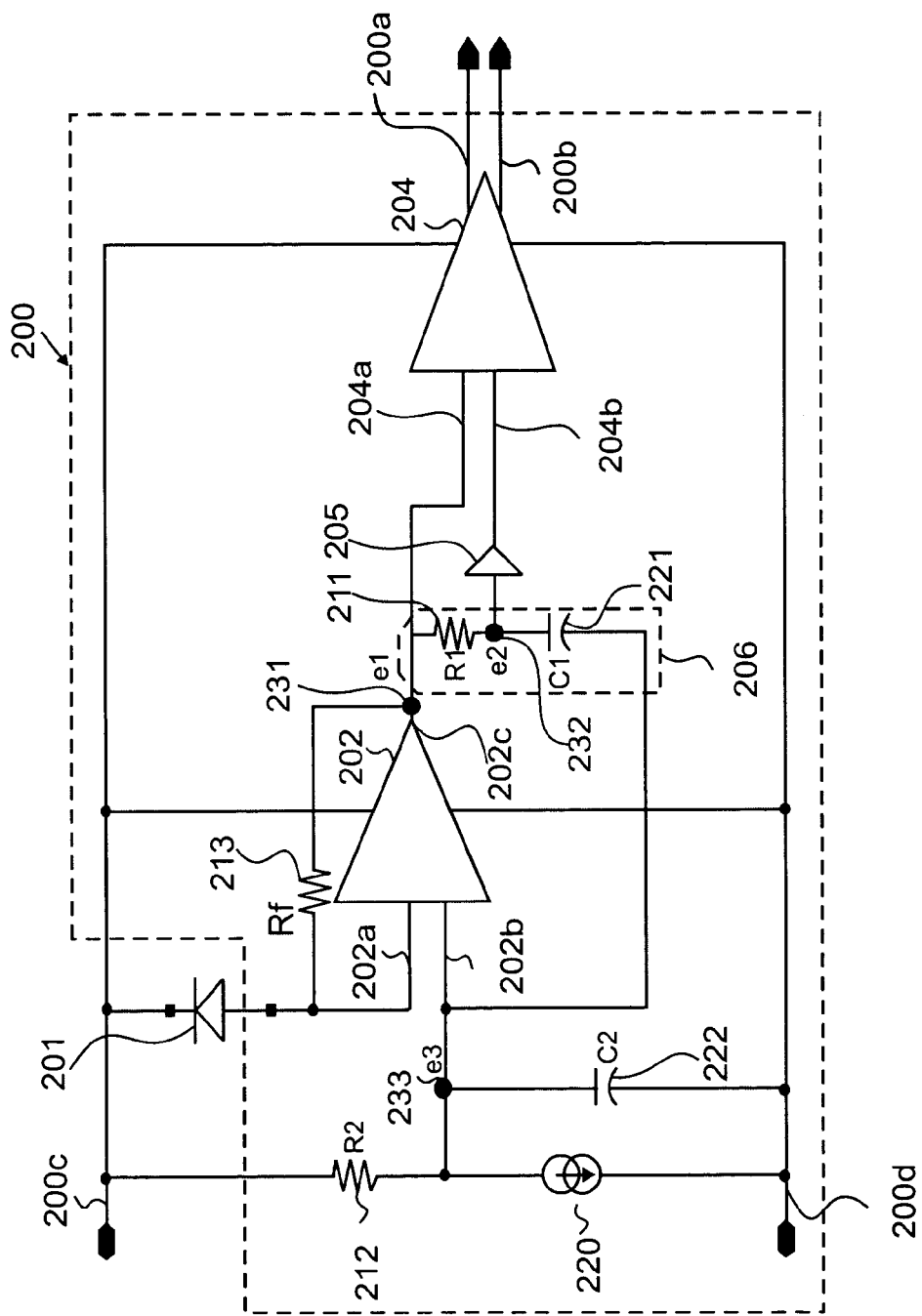

An amplifier circuit 200 that overcomes the limitations of the prior art in accordance with an embodiment of the invention is shown in an embodiment illustrated in FIG. 2. Within the circuit 200 there is disposed a TIA 202 with a first input port 202a and a second input port 202b. The first input port 202a is preferably a negative input port 202a and the second input port 202b is preferably the positive input port 202b. The first input port 202a is connected to a photodetector 201, preferably a photodiode 201 in the form of a PIN diode anode terminal, with the cathode of the photodiode 201 connected to the first voltage input port 200c for receiving a preferably positive input voltage (Vpos) from a power supply (not shown). The photodiode 201 provides a current ($I_{signal}$) to the TIA 202. A shunt feedback resistor 213 is disposed between the first input port 202a and a TIA output port 202c, the shunt feedback resistor 213 for propagating a feedback signal from the output port 202c affecting a gain of the TIA 202. The second input port 202b is connected to a first biasing circuit for receiving a first bias signal therefrom. The first biasing circuit includes a third node e3 233 having a resistor R2 212 connected from this node 233 to the first voltage input port 200c. A first current source I1 220 is disposed in series between a second voltage input port 200d, preferably for receiving a ground potential from the power supply (not shown), and the third node e3 233. A capacitor C2 222 is disposed in parallel with the first current source 220 to limit thermal noise contributions of resistor R2 212.

A voltage at a third node e3 233 is determined by Equation (1):

a. $$e3 = \frac{Vpos - I_1 * R2}{1 + S * C2 * R2} \quad (1)$$

where S is the Laplace operator. From Equation (1) it is seen that the noise in the power supply (Vpos) is propagated to the positive input port 202b of the TIA 202 and the thermal noise from R2 is preferably attenuated by a pole formed by C2*R2. The output signal of the TIA 202 at a first node e1 231 is determined by Equation (2):

a.
$$e_1 = \frac{V_{pos} - I*R_2}{1+S*C_2*R_2} - I_{signal}*R_f \qquad (2)$$

Equation (2) is based on the assumption that the TIA 202 has infinite open loop gain.

The output signal from the TIA 202 is in the form of an amplified signal derived from amplification of the photocurrent ($I_{signal}$) received by the photodiode 201 as well as unwanted power supply noise, arising from the power supply connected to the first and second voltage input ports 200c and 200d.

The output port 202c of the TIA 202 is connected to a positive input port 204a of the differential amplifier 204 for providing the TIA output signal thereto. In addition, the TIA output signal is provided to a filter circuit 206. The filter circuit 206 is formed from resistor R1 211 and capacitor C1 221. A second node e2 232 forms an output port of the filter circuit 206, where this filter output port 232 is for providing a filtered signal and is coupled to the negative input port 204b of the differential amplifier 204 via a unity gain buffer 205. The unity gain buffer 205 is used to prevent a DC offset between the input ports of the differential amplifier 204. Capacitor C1 221 is disposed between the second node e2 232 and the positive input port 202b of the TIA 202. With respect to the TIA output signal from output port 202c, the filter circuit 206 acts as a low pass filter, for attenuating high frequency components of filter output signal provided at the second node e2 232. With respect to the first bias signal provided to the positive input port 202b of the TIA 202, the filter circuit 206 acts as a high pass filter, attenuates low frequency components of this signal at the output port of the second node e2 232.

The voltage at the second node e2 232, or at the output port of the filter circuit 206, is determined by Equation (3):

$$e_2 = \frac{V_{pos} - I_1*R_2}{1+S*C_1*R_1}(1+S*C_2*R_2) - \frac{I_{signal}*R_f}{1+S*C_1*R_1} + \frac{S*C_1*R_1(V_{pos} - I_1*R_2)}{1+S*C_1*R_1}(1+S*C_2*R_2) \qquad (3)$$

Assuming the differential amplifier 204 has a voltage gain $G_{diff}$, an output signal differential voltage $V_{out}$ provided as a potential difference on a positive output port ($V_{outP}$) 200a and negative output port ($V_{outN}$) 200b of the differential amplifier 204 is expressed by Equation (4):

a. $V_{out} = (V_{outP} - V_{outN}) = G_{diff}*(e1 - e2)$ (4)

A small signal transimpedance gain (Tz) of the TIA 202 is determined by Equation (5):

a.
$$Tz = G_{diff}*Rf \frac{S*C1*R_1}{1+S*C_1*R_1} \qquad (5)$$

where the small signal transimpedance gain (Tz) is determined by gain from the TIA 202 as a result of the feedback resistor Rf 213 and the differential amplifier 204 gain ($G_{diff}$). The power supply noise expressed as Vpos is advantageously attenuated. In addition, the inclusion of the RC network formed by the first resistor R1 211 and the second capacitor C1 221 determine a zero pole in the small signal gain, where the position of this zero pole is determined by C1*R1.

The circuit in accordance with an embodiment of the invention shown in FIG. 2 is absent the dummy TIA 105 used to DC bias the differential amplifier 104 (as shown in FIG. 1). This advantageously reduces the power dissipation of the circuit. Furthermore, capacitor C2 222 is used to reduce the thermal noise contribution of resistor R2 212 and thus C2 222 does not have a high capacitance value. Since capacitor C2 222 does not have a high capacitance value it therefore does not occupy a large area when integrated to form the IC amplifier of FIG. 2. Thus, the PSR amplifier circuit 200 shown in FIG. 2 requires less chip area and advantageously provides lower power dissipation without having a 1.5 dB optical penalty resulting from the use of a dummy TIA 105 (FIG. 1).

The TIA 202, preferably operates as a unity gain voltage amplifier that provides both power supply noise as well as the desired signal $I_{signal}*Rf$ at the output port thereof. Advantageously, the filter circuit 206 formed from resistor R1 211 and capacitor C1 221 results in a significant rejection of power supply noise at the output ports 200a and 200b of the differential amplifier 204.

The TIA 202 preferably operates in a differential manner, where the negative input port 202a is used to provide a low impedance input port for amplifying input current ($I_{signal}$) from the photodiode 201 and the positive input port 202b is a high impedance input port that is used to provide the DC bias to the positive input port 202b. The positive input port also allows for power supply noise in the form of a power supply voltage ripple signal ($V_{ripple}$) to appear at the TIA output port 202c with the power supply noise having a substantially unchanged amplitude, as found in Equation (6).

a. $V_{out} = V_{ripple} - Rf*I_{signal}$ (6)

Advantageously, the first biasing circuit comprising the second resistor R2 212 and the first current source I1 220 are used to provide the bias voltage, in the form of the first bias signal, to the third node e3 233, as opposed to using a resistor potential divider network. Typically, many techniques in the prior art attempt to suppress the power supply ripple at the TIA stage from appearing at the TIA output port, which results in an addition of power supply noise to the desired output signal Rf*$I_{signal}$. By allowing power supply ripple to appear in the TIA output signal with a substantially unchanged amplitude, the use of the filter circuit 206 advantageously allows for substantial canceling of the power supply ripple by the differential amplifier 204 when these signals are differentially amplified and provided to the output ports of the amplifier circuit 200a and 200b. Of course, the differential amplifier preferably has circuitry therein for providing a high differential gain and a high common mode rejection (CMR).

Further advantageously, the amplifier circuit shown in FIG. 2 facilitates integration within an integrated circuit with a minimal external component count. Typically, the only external component that is provided with the integrated circuit 200 is a photodiode. This allows for disposing the circuit 200 in a confined space of an optical receiver module.

Optionally, if the embodiment of the invention is used with lower data rates, for example data rates that have a bit transition frequency lower than in the GHz range, then the first capacitor C1 221 used within the filter circuit 206 is preferably of a larger value and is thus preferably implemented as an external component. The use of a high valued first capacitor C1 221 allows the low frequency TIA output signal to be substantially unfiltered by the filter circuit 206.

Numerous other embodiments may be envisaged without departing from the spirit or scope of the invention.

What is claimed is:

1. A circuit for connecting to a power supply having power supply noise, the circuit for amplifying an input signal from a photodetector comprising:
   a transimpedance amplifier (TIA) circuit for operating in a differential manner and having a gain and a first input port for receiving the input signal from the photodetector, a second input port and an output port, the TIA circuit for providing a TIA circuit output signal comprising a voltage ripple signal dependent on the power supply noise and an amplified signal dependent on the input signal and the gain of the TIA circuit;
   a first biasing circuit coupled to the second input port for providing a first bias signal thereto, the first bias signal including the voltage ripple signal dependent on the power supply noise; and,
   a filter circuit coupled to the output port of the TIA circuit for filtering the TIA circuit output signal to form a filtered signal, the filter circuit for filtering the TIA circuit output signal in dependence upon a component of the first bias signal and for providing the filtered signal to a filter output port thereof.

2. A circuit according to claim 1 wherein the filter circuit comprises a high pass filter circuit for attenuating low frequency components of the voltage ripple signal provided to the filter output port.

3. A circuit according to claim 1 wherein the filter circuit comprises a low pass filter for attenuating high frequency components of the TIA circuit output signal provided to the filter output port.

4. A circuit according to claim 1 comprising a differential amplifier having a positive input port for receiving the TIA circuit output signal and having a negative input port for receiving the filtered signal, the differential amplifier having a two output ports for providing a differential output signal therefrom, the differential output signal representative of an amplified difference between the TIA circuit output signal and filtered signal, and an attenuated other than difference between the TIA circuit output signal and filtered signals.

5. A circuit according to claim 4 comprising a unity gain buffer disposed between the negative input port of the differential amplifier and the filter output port for reducing a DC voltage level offsets for input signals received between the two input ports of the differential amplifier.

6. A circuit according to claim 4 wherein the first biasing circuit other than comprises a dummy TIA circuit for DC biasing of one of the negative input port and the positive input port of the differential amplifier.

7. A circuit according to claim 1 wherein the biasing circuit comprises:
   a first current source for providing a portion of a first current to the second input port of the TIA circuit and another portion of the first current to the filter circuit.

8. A circuit according to claim 7 wherein the biasing circuit comprises:
   a first resistor disposed between a first voltage input port for receiving a positive voltage and the positive input port of the TIA circuit.

9. A circuit according to claim 8 wherein the biasing circuit comprises:
   a first capacitor disposed in parallel with the first current source, the first capacitor for reducing the thermal noise contributions of the first resistor.

10. A circuit according to claim 7 wherein the biasing circuit comprises:
    circuitry generating a bias signal including the voltage ripple signal dependent on the power supply noise wherein the circuitry is other than a resistor potential divider circuit.

11. A circuit according to claim 1 wherein the TIA circuit comprises circuitry for operating as a unity gain voltage amplifier.

12. A circuit according to claim 1 wherein the TIA circuit comprises electrical circuitry for providing a high differential gain and a high common mode rejection when amplifying the TIA circuit input signals to provide the TIA circuit output signal.

13. A method of performing power supply noise rejection for providing an output signal comprising the steps of:
    providing a TIA circuit having two input ports;
    providing an input signal from a photodetector for amplification to a negative input port of the TIA circuit;
    providing a first bias signal having a voltage ripple to a positive input port of the TIA circuit;
    amplifying the input signal to form a portion of an amplified signal, the amplified signal comprising a noise signal representative of power supply noise and an amplified version of the input signal;
    filtering the amplified signal to form a filtered signal in dependence upon the first bias signal comprised of power supply noise;
    differentially amplifying the filtered signal and the amplified signal to provide an output signal from the TIA circuit having an amplified version of the input signal and an attenuated version of the power supply noise.

14. A method according to claim 13 wherein a magnitude of the voltage ripple provided in the amplified signal is of an approximately same magnitude as the voltage ripple provided at the output port of the filter circuit.

15. A method according to claim 13 wherein the TIA circuit amplifies the input signal and first bias signal in a differential manner.

16. A method according to claim 13 wherein the negative input port of the TIA circuit is a low impedance input port.

17. A method according to claim 13 wherein the positive input port of the TIA circuit is a high impedance input port for providing DC bias to the positive input port.

18. A single ended to dual conversion circuit comprising:
    a transimpedance amplifier (TIA) circuit for operating in a differential manner and having a gain and a first input port for receiving an input signal from the photodetector, a second input port and an output port, the TIA circuit for providing a TIA circuit output signal comprising a voltage ripple signal dependent on a power supply noise and an amplified signal dependent on the input signal and the gain of the TIA circuit;
    a first biasing circuit coupled to the second input port for providing a first bias signal thereto, the first bias signal comprising the voltage ripple signal dependent on the power supply noise;
    a filter circuit coupled to the output port of the TIA circuit for filtering the TIA circuit output signal to form a filtered signal, the filter circuit for filtering the TIA circuit output signal in dependence upon a componet of the first bias signal and for providing the filtered signal to a filter output port thereof; and a differential amplifier having a positive input port for receiving the TIA circuit output signal and having a negative input port for receiving the filtered signal, the differential amplifier having a two output ports for providing a differential output signal therefrom, the differential output signal representative of an amplified difference between the TIA circuit output signal and filtered signal, and an attenuated other than difference between the TIA circuit output signal and filtered signal.

* * * * *